United States Patent [19]

Crook et al.

[11] Patent Number: 5,625,292

[45] Date of Patent: *Apr. 29, 1997

[54] SYSTEM FOR MEASURING THE INTEGRITY OF AN ELECTRICAL CONTACT

[75] Inventors: David T. Crook; Kevin W. Keirn, both of Loveland, Colo.; Ugur Cilingiroglu, Istanbul, Turkey

[73] Assignee: Hewlett-Packard Company, Palo Alto, Calif.

[*] Notice: The term of this patent shall not extend beyond the expiration date of Pat. No. 5,254,953.

[21] Appl. No.: 139,362

[22] Filed: Oct. 19, 1993

Related U.S. Application Data

[63] Continuation-in-part of Ser. No. 127,400, Sep. 27, 1993, abandoned, which is a continuation of Ser. No. 892,868, Jun. 3, 1992, Pat. No. 5,254,953, which is a continuation-in-part of Ser. No. 631,609, Dec. 20, 1990, Pat. No. 5,124,660.

[51] Int. Cl.$^6$ .................................................. G01R 31/02
[52] U.S. Cl. ......................... 324/538; 324/537; 324/750
[58] Field of Search ................................. 324/537, 538, 324/555, 658, 750, 765

[56] References Cited

U.S. PATENT DOCUMENTS

| | | | |
|---|---|---|---|
| 3,798,541 | 3/1974 | Campbell, Jr. et al. | 324/72.5 |
| 3,975,680 | 8/1976 | Webb | 324/61 P |
| 4,055,801 | 10/1977 | Pike et al. | 324/73 R |
| 4,056,773 | 11/1977 | Sullivan | 324/500 |
| 4,114,093 | 9/1978 | Long | 324/73 AT |
| 4,186,338 | 1/1980 | Fichtenbaum | 324/521 |
| 4,520,318 | 5/1985 | Hascal et al. | 324/457 |
| 4,565,966 | 1/1986 | Burr et al. | 324/73 PC |
| 4,583,042 | 4/1986 | Riemer | 324/73 PC |
| 4,620,304 | 10/1986 | Faran, Jr. et al. | 371/20 |
| 4,695,788 | 9/1987 | Marshall | 324/527 |
| 4,779,041 | 10/1988 | Williamson, Jr. | 324/537 |
| 4,789,829 | 12/1988 | Stribling | 324/263 |

(List continued on next page.)

FOREIGN PATENT DOCUMENTS

| | | |
|---|---|---|
| 0177210 | 4/1986 | European Pat. Off. |
| 0317440 | 5/1989 | European Pat. Off. |
| 0492806 | 7/1992 | European Pat. Off. |
| 0560484 | 9/1993 | European Pat. Off. |
| 2101335 | 3/1972 | France |
| 2143954 | 2/1985 | United Kingdom |
| 2179751 | 3/1987 | United Kingdom |

OTHER PUBLICATIONS

Crook, D., "A Fourth Generation Analog Incircuit Program Generator," *International Test Conference Paper 28.3*, pp. 605–612 (1990) (no month provided).

*Introduction to Multi–Strategy Testing*, GenRad, Inc., pp. 3–11—3–16 (Jul. 1989).

*Test Set Preparation 227X Board Test Workstations*, GenRad, Inc., pp. 1–21—1–27 (May 1988).

*Introduction to In–Circuit Testing*, GenRad, Inc., p. 122 (3d Ed. Jan. 1985).

*Introduction to In–Circuit Testing*, GenRad, Inc., pp. 34–37 (ed Ed. May 1984).

"Introduction to Guarding," *Analog In–Circuit Measurement System Option M809/M766 Application Handbook*, Teradyne, Inc., pp. 13–22 (Mar. 1983).

Crook, D., "Analog In–Circuit Component Measurements: Problems and Solutions," *Hewlett–Packard Journal*, pp. 19–22 (Mar. 1979).

(List continued on next page.)

*Primary Examiner*—Kenneth A. Wieder
*Assistant Examiner*—Glenn W. Brown

[57] ABSTRACT

Disclosed is a system that determines whether pins of electrical components such as connectors, switches, and sockets are present and properly soldered to a printed circuit board. The system uses an oscillator which supplies a signal, typically ten kilohertz (10 kHz) at 0.2 volts, to the pin under test. A conductive electrode is placed on top of the component. The electrode is connected to a current measuring device. Another pin of the component is connected to a common signal return.

28 Claims, 3 Drawing Sheets

U.S. PATENT DOCUMENTS

| | | | |
|---|---|---|---|
| 4,801,866 | 1/1989 | Wixley | 324/73 PC |
| 4,801,878 | 1/1989 | Peiffer et al. | 324/158 T |
| 4,894,605 | 1/1990 | Ringleb et al. | 324/537 |
| 4,896,108 | 1/1990 | Lynch et al. | 324/158 T |
| 4,918,376 | 4/1990 | Poduje et al. | 324/663 |
| 4,928,057 | 5/1990 | Williams | 324/72 |
| 5,006,808 | 4/1991 | Watts | 324/537 |
| 5,075,621 | 12/1991 | Hoyt | 324/158 P |
| 5,081,421 | 1/1992 | Miller et al. | 324/671 |
| 5,101,152 | 3/1992 | Harwood et al. | 324/158 R |
| 5,111,137 | 5/1992 | Heumann et al. | 324/158 R |
| 5,124,660 | 6/1992 | Cilingiroglu | 324/538 |
| 5,132,607 | 7/1992 | Shah et al. | 324/72.5 |
| 5,138,226 | 8/1992 | Stearns | 324/537 |
| 5,187,430 | 2/1993 | Marek et al. | 324/66 |
| 5,202,640 | 4/1993 | Schaaf et al. | 324/158 F |
| 5,212,992 | 5/1993 | Calhoun et al. | 73/864.01 |
| 5,254,953 | 10/1993 | Crook et al. | 324/538 |
| 5,308,250 | 5/1994 | Walz | 439/63 |

OTHER PUBLICATIONS

Hall, H.P. et al., "The Use of Active Devices In Precision Bridges," *Electrical Engineering*, 81(5):pp. 367–372 (May 1962).

*HP 3065X/L Board Test System Users' Manual Vol. 1:System Reference*, Hewlett–Packard Company, pp. 20–21—20–34 (Nov. 1985).

*HP 3070 Board Test System Users' Manual Test Methods: Shorts and Analog*, Hewlett–Packard Company, pp. 2–1—2–24 (Apr. 1989).

Schwartz, P., "Test Structural: Déjà une troisème version", pp. 22–23, *Electronique*, No. 25, (Feb. 1993), Paris, France.

"Test Programming 227X Board Test Workstations", (Release 8.1.1), pp. 1–2—1–7, GenRad, Inc. (1985) (no month provided).

"227X/2282 Tips and Hints", *GenRad Software Support Program, Technical Newsletter*, vol. 3, No. 1, pp. 1–3, (Spring 1989).

"Sales Brochure", QA Technology Co., Inc., pp. 1–28 (1990) (no month provided).

"HP has SMT–ASIC tester," *Electrical Engineering Times*, (Jan. 11, 1993).

European Patent Application No. 91 310861.9, Office Action Dated Dec. 15, 1994.

European Patent Application No. 91 310 861.9, Search Report (Aug. 20, 1992).

European Patent Application No. 93 303 722.8, Search Report (Feb. 22, 1994).

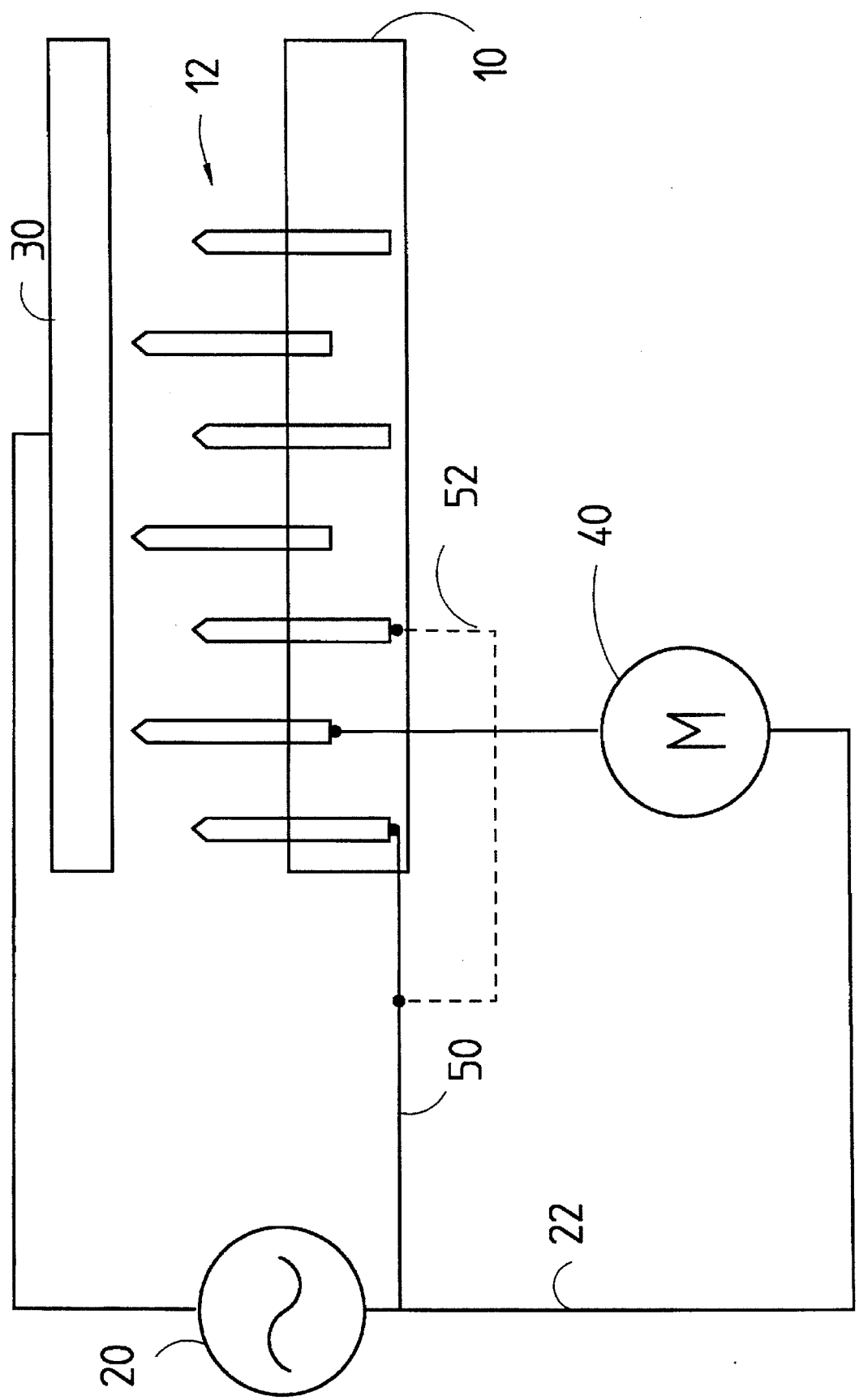

SYSTEM FOR MEASURING THE INTEGRITY OF AN ELECTRICAL CONTACT

CROSS-REFERENCE TO RELATED APPLICATIONS

This is a continuation-in-part of application Ser. No. 08/127,400, filed Sep. 27, 1993, now abandoned, which is a continuation of application Ser. No. 07/892,868, filed Jun. 3, 1992, now U.S. Pat. No. 5,254,953, issued Oct. 19, 1993, which is a continuation-in-part of application Ser. No. 07/631,609, filed Dec. 20, 1990, now U.S. Pat. No. 5,124,660, issued Jun. 23, 1992.

FIELD OF THE INVENTION

The present invention relates generally to measuring and testing devices and more particularly to an apparatus and method for testing the integrity of a connection between a circuit assembly (e.g., printed circuit board) and a pin of an electrical component, such as a connector, push button switch, DIP switch, socket, integrated circuit, and the like.

BACKGROUND OF THE INVENTION

The technological background and the essential features of the present invention are described in application Ser. No. 08/127,400, the parent of the present application, which is hereby incorporated by reference in its entirety. The parent application focussed on, but did not restrict the invention to, applications of the invention involving the testing of integrated circuits. The claims of this application are directed to use of the disclosed invention in connection with the testing of connectors, push button switches, DIP switches, sockets, and the like, as well as integrated circuits.

FIG. 1 of the accompanying drawings depicts a connector 10 comprising a plurality of pins 12, a printed circuit board 14, and a board support fixture 16. The pins 12 are typically soldered to a solder pad on the top surface of the board 14 or, alternatively, inserted through holes in the board and soldered to the bottom surface of the board. In addition, electrically conductive traces (not shown) are typically printed on a surface of the board 14. These components are well known and are discussed herein only because one preferred application of the present invention involves testing solder joints between pins of an electrical connector and solder pads or other nodes of a printed circuit board with a bed of nails automatic tester. However, it should be noted that the present invention is by no means limited to connectors or to the one type of connector depicted in FIG. 1. For further background information relating to the present invention, the reader is referred to the above-cited application Ser. No. 08/127,400.

SUMMARY OF THE INVENTION

According to the present invention, a system for measuring the integrity of an electrical contact between an electrical connection pin of an electrical component and a circuit assembly comprises a signal supply supplying an electrical signal to a first pin of the electrical component; an electrical connection between a second and a common signal return of the signal supply; a conductive electrode comprising a surface adapted to be placed in a fixed position in proximity to said pins; and measuring means for measuring a parameter indicative of the integrity of the connection of the first pin to the circuit assembly. An important aspect of preferred embodiments of the invention is that the electrical component may comprise a connector, push button switch, DIP switch, socket, integrated circuit, or any other type of component comprising a plurality of connection pins.

In addition, in one preferred embodiment of the invention the measuring means comprises means for comparing a measured quantity associated with each of the plurality of pins to a pre-established threshold for each pin and determining the integrity of the electrical connections between the plurality of pins and the circuit assembly on a pin by pin basis. Preferred embodiments of the invention also include error indicating means for indicating an error condition whenever the parameter is not within predetermined limits. In this embodiment, a measurement lower than a lower limit indicates an open pin. Preferred embodiments also include means for connecting at least one other node of the circuit assembly to the common signal return.

The measuring means may advantageously comprise means for measuring an electrical current or voltage between the conductive electrode and the common signal return of the signal means. Alternatively, the connections to the signal means and the measuring means may be interchanged. Thus, the measuring means may be connected either between the common signal return and the conductive electrode or between the pin being tested and the common signal return. The latter configuration is useful when the impedances paralleling the measuring means are known to be high enough to not adversely affect the repeatability of the measurement. The current measuring means in other embodiments of the invention also comprises means for holding the current measurement connection to a virtual ground. This virtual ground may be implemented with conventional operational amplifier circuitry.

In addition, a computing means may be operatively coupled to the measuring means to compute the effective capacitance and determine when the measured parameter falls outside predetermined limits such that a determination is made that the pin being tested is diagnosed as being open. In other embodiments, the computing means may make such a determination based on the units of the measurement without converting to units of capacitance.

Preferred embodiments of the invention use a metallic electrode, such as copper foil, placed adjacent to the component pins. A connection is then made, through a bed of nails fixture, to a printed circuit board wiring trace or solder pad that connects to the component pin being tested. This connection is in turn connected to a signal supply. The foil electrode is connected to an ac current measuring means. The oscillator is set to apply a voltage to the pin being tested. The oscillator may, e.g., be set to 0.2 volts RMS amplitude and a frequency of 8–10 kilo Hertz (kHz), e.g., 8.192 kHz. At least one other node of the circuit assembly is connected to the common signal return of the oscillator. Typically, the pin of the component which is attached to the circuit assembly ground plane (if available) is among the pins chosen to be connected to the common signal return of the oscillator. Often, all nodes of the assembly, other than the node that includes the pin being tested, are connected to the common signal return of the oscillator.

Because the metallic electrode typically covers the entire component, it is also capacitively coupled to all other pins of the package. This structure forms capacitors between each of the component pins and the conductive electrode. The component also exhibits capacitance between each pair of pins of the component. Additional capacitances are found between pairs of printed circuit traces that are attached to the component being tested. The effect of these "parasitic" capacitances is reduced by connecting one or more pins (i.e., pins other than the pin currently being tested) to the common signal return of the signal supply.

Other features of the invention are described below.

BRIEF DESCRIPTION OF THE DRAWINGS

FIG. 2B depicts an alternative embodiment of a system in accordance with the present invention. In this embodiment, the signal supply and measuring means have been interchanged.

DESCRIPTION OF PREFERRED EMBODIMENTS

Figure 1:
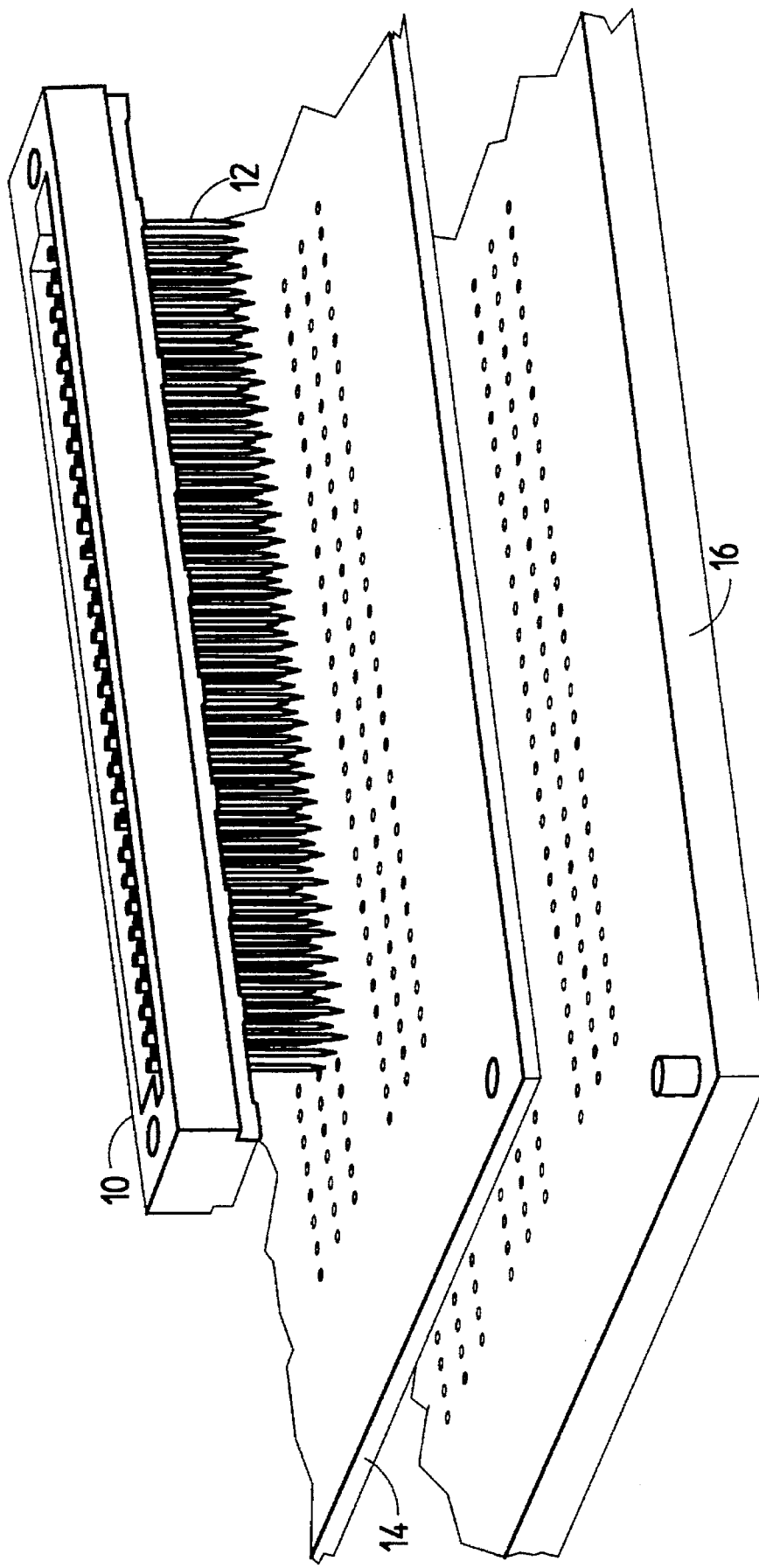
FIG. 1 depicts a connector comprising a plurality of pins. This figure also depicts a printed circuit board and a board support fixture.
Figure 2A:
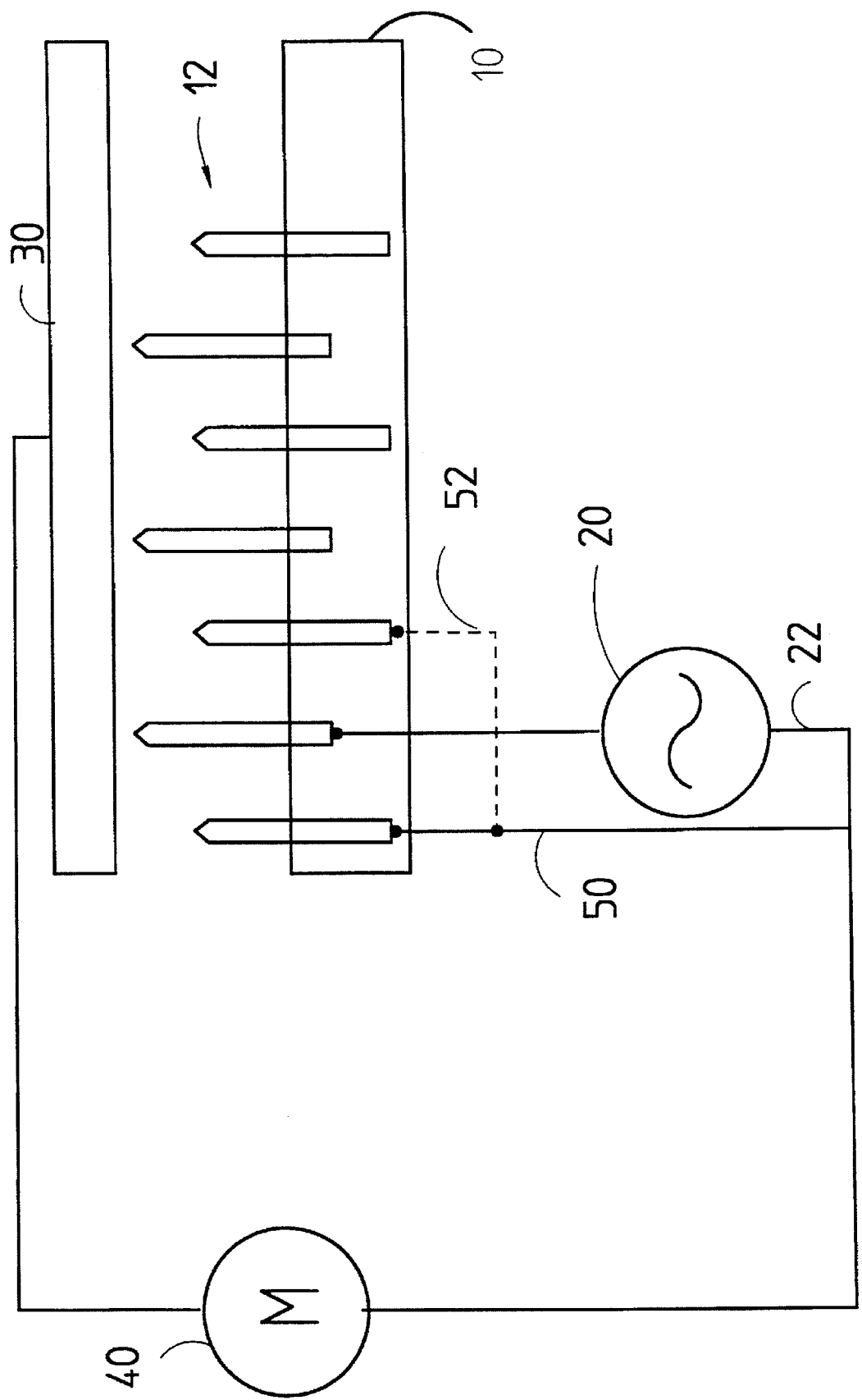
FIG. 2A schematically depicts one embodiment of a system in accordance with the present invention for measuring the integrity of an electrical contact between a pin of an electrical component and a circuit assembly.

Referring to FIG. 2A, one presently preferred application of the invention involves determining the quality of the connection between a pin of a connector 10 and a circuit assembly or printed circuit board. In FIGS. 2A and 2B, the printed circuit board is not shown. Instead, the connection between a signal supply 20 and a pin is shown schematically with a simple line. In reality, however, the connection between the signal supply and the pin would typically (but not necessarily) be through a bed of nails fixture and a trace or solder pad of a printed circuit board.

As shown, a conductive electrode (probe) 30 is disposed above the connector 10, in close proximity to the pins 12. A current or voltage measuring instrument 40 is coupled between the electrode 30 and a common signal return 22 of the signal supply 20. In addition, another pin of the component is connected to the common signal return 22 by a connection 50. Moreover, in some circumstances it will be advantageous to connect one or more other pins to the common signal return 22, as indicated by the dash line connection 52. FIG. 2B depicts a second embodiment in which the signal supply 20 and measuring instrument 40 are interchanged.

The operation of the system in testing connectors, switches, sockets, etc., is substantially the same as in testing integrated circuits. However, in testing connectors, switches, etc., capacitance threshold levels are preferably set on a per pin basis. That is, the system is calibrated as follows: Measured responses (e.g., computed capacitance values based on measured currents or voltages, or the measured quantities themselves) are determined for each pin of a particular type of component, wherein it is assured (e.g., by visual inspection) that the pins have good solder connections to the board. The threshold values are then set, for each pin, as a fixed percentage (e.g., 60%) of the measured response for that pin. Thereafter, as additional components of that type are tested, when the measured response for a particular pin is less than the prescribed threshold for that pin, the connection for that pin is declared faulty. Of course, the present invention is by no means limited to the use of a 60% threshold. The threshold values actually employed will vary in dependence upon the specific type of component being tested (connector, DIP switch, etc.) and the specific geometry of the units being tested.

Further explanation of the theory underlying the present invention, particularly the use of connections between the common signal return and the pins of the component being tested, is provided in application Ser. No. 08/127,400.

What is claimed is:

1. A system for measuring the integrity of an electrical contact between an electrical connection pin of an electrical component comprising a plurality of connection pins and a circuit assembly, said system comprising:
   (a) a signal supply, comprising an output and a common signal return, supplying an electrical signal via said output to a first pin of said electrical component;
   (b) an electrical connection between a second pin of said electrical component and said common signal return of said signal supply;
   (c) a conductive electrode comprising a surface placed in a fixed position in proximity to said first and second pins; and
   (d) measuring means, operatively coupled to said conductive electrode, for determining a parameter indicative of the integrity of the electrical connection between said first pin and said circuit assembly.

2. A system as recited in claim 1, wherein said measuring means comprises means for comparing a measured quantity associated with each of said plurality of pins to a pre-established threshold for each pin and determining the integrity of the electrical connections between said plurality of pins and said circuit assembly on a pin by pin basis.

3. A system as recited in claim 1, further comprising error indicating means for indicating an error condition whenever said parameter is not within predetermined limits.

4. A system as recited in claim 1, further comprising means for connecting at least one other node of said circuit assembly to said common signal return.

5. A system as recited in claim 1, wherein said measuring means comprises means for measuring an electrical current.

6. A system as recited in claim 1, wherein said measuring means comprises means for measuring an electrical voltage.

7. A system as recited in claim 1, wherein said measuring means is connected between said common signal return and said conductive electrode.

8. A system as recited in claim 1, wherein the electrical signal supplied by the signal supply oscillates at a frequency of approximately 8–10 kHz.

9. A system for measuring the integrity of an electrical contact between a first electrical connection pin of an electrical component comprising a plurality of connection pins and a circuit assembly, said system comprising:
   (a) a signal supply, comprising an output and a common signal return, for supplying an electrical signal via said output;
   (b) an electrical connection between a second pin of said electrical component and said common signal return of said signal supply;
   (c) a conductive electrode, coupled to said output of said signal supply, comprising a surface placed in a fixed position in proximity to said pins; and
   (d) measuring means, operatively coupled to said first pin, for determining a parameter indicative of the integrity of the electrical connection between said second pin and said circuit assembly.

10. A system as recited in claim 9, wherein said measuring means comprises means for comparing a measured quantity associated with each of said plurality of pins to a pre-established threshold for each pin and determining the integrity of the electrical connections between said plurality of pins and said circuit assembly on a pin by pin basis.

11. A system as recited in claim 9, further comprising error indicating means for indicating an error condition whenever said parameter is not within predetermined limits.

12. A system as recited in claim 9, further comprising means for connecting at least one other node of said circuit assembly to said common signal return.

13. A system as recited in claim 9, wherein said measuring means comprises means for measuring an electrical current.

14. A system as recited in claim 9, wherein said measuring means comprises means for measuring an electrical voltage.

15. A system as recited in claim 9, wherein said measuring means is connected between said common signal return and said second pin.

16. A system as recited in claim 9, wherein the electrical signal supplied by the signal supply oscillates at a frequency of approximately 8–10 kHz.

17. A method for measuring the integrity of an electrical contact between an electrical connection pin of an electrical component comprising a plurality of connection pins and a circuit assembly, said method comprising the steps of:

(a) placing a conductive electrode in a fixed position in proximity to a surface of said pins;

(b) supplying an electrical signal from a signal generator to one of either said conductive electrode or a first pin;

(c) electrically connecting a second pin to a common signal return of said signal generator; and (d) measuring a parameter indicative of the integrity of the connection of said first pin to said circuit assembly;

wherein said electrical component comprises one member of the group: connector, push button switch, DIP switch, socket, and integrated circuit.

18. A method as recited in claim 17, further comprising the step of comparing a measured quantity associated with each of said plurality of pins to a pre-established threshold for each pin and determining the integrity of the electrical connections between said plurality of pins and said circuit assembly on a pin by pin basis.

19. A method as recited in claim 17, further comprising the step of indicating an error condition whenever said parameter is not within predetermined limits.

20. A method as recited in claim 17, further comprising the step of connecting at least one other pin of said component to said common signal return.

21. A method as recited in claim 17, wherein the measuring step (d) comprises measuring an electrical current.

22. A method as recited in claim 17, wherein the measuring step (d) comprises measuring an electrical voltage.

23. A method as recited in claim 17, wherein the measuring step (d) comprises measuring said parameter between said common signal return and said electrical component.

24. A method as recited in claim 17, wherein the measuring step (d) comprises measuring the parameter between said conductive electrode and said common signal return.

25. A method as recited in claim 17, wherein the electrical signal supplied by the signal generator oscillates at a frequency of approximately 8–10 kHz.

26. A method for measuring the integrity of an electrical contact between a first electrical connection pin of an electrical component and a circuit assembly, said method comprising the steps of:

(a) supplying, with a signal supply, an electrical signal to said circuit assembly;

(b) positioning a conductive electrode in a fixed position in proximity to a surface of said first pin;

(c) measuring a parameter indicative of the integrity of the electrical contact between said first pin and said circuit assembly; and (d) attenuating spurious electrical signals which may inject capacitively into the conductive electrode through pins of said electrical component other than said first pin.

27. The method of claim 26 wherein said step of attenuating spurious electrical signals comprises electrically connecting at least one other connection pin of said electrical component to a common signal return of the signal supply.

28. The method of claim 26 further comprising the step of indicating an error condition whenever said parameter is lower than a predetermined threshold.

* * * * *